United States Patent
Juco et al.

(10) Patent No.: US 7,094,313 B2
(45) Date of Patent: Aug. 22, 2006

(54) UNIVERSAL MID-FREQUENCY MATCHING NETWORK

(75) Inventors: Eller Y. Juco, San Jose, CA (US); Visweswaren Sivaramakrishnan, Santa Clara, CA (US); Mario David Silvetti, Morgan Hill, CA (US); Talex Sajoto, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 360 days.

(21) Appl. No.: 10/829,520

(22) Filed: Apr. 21, 2004

(65) Prior Publication Data

US 2005/0235916 A1    Oct. 27, 2005

(51) Int. Cl.
*C23F 1/02* (2006.01)
*C23C 14/00* (2006.01)
*C23C 16/00* (2006.01)

(52) U.S. Cl. ............ 156/345.44; 156/345.48; 204/298.08; 204/298.07; 118/723 VE; 118/723 R (58) Field of Classification Search .......... None
See application file for complete search history.

(56) References Cited

U.S. PATENT DOCUMENTS 6,252,354 B1 *  6/2001  Collins et al. .......... 315/111.51
6,495,963 B1 * 12/2002  Bennett ................. 315/111.51
6,819,096 B1 * 11/2004  Gonzalez et al. ....... 324/117 R

* cited by examiner

*Primary Examiner*—Tuyet Thi Vo
(74) *Attorney, Agent, or Firm*—Townsend and Townsend and Crew LLP (57) ABSTRACT

A substrate processing system is provided with a processing chamber, an alternating voltage supply, and an impedance matching network. The processing chamber holds a substrate during processing and the alternating voltage supply is connected with the processing chamber to capacitively couple energy to a plasma formed within the processing chamber. The impedance matching network is coupled with the alternating voltage supply and has a variable resistive element and a variable reactive element, whose states respectively define distinct real and imaginary parts of an impedance.

21 Claims, 6 Drawing Sheets

UNIVERSAL MID-FREQUENCY MATCHING NETWORK

BACKGROUND OF THE INVENTION

Among the wide variation in techniques available to process semiconductor substrates are plasma deposition processes. These processes are similar to conventional chemical-vapor-deposition ("CVD") techniques in which reactive gases are supplied to the substrate surface where heat-induced chemical reactions take place to process the substrate, either by depositing a desired film or by etching the film depending on the chemistry. Plasma CVD techniques such as plasma-enhanced CVD ("PECVD") increase the reactivity near the substrate by promoting excitation and/or dissociation of reactant gases through the application of radio-frequency ("RF") energy to a reaction zone near the substrate surface. Because o the increase in reactivity, the energy needed for a chemical reaction to take place is reduced, allowing the temperature for such processes to be lower than for thermal CVD processes.

There are different known methods of coupling the energy from an RF source to the plasma. In one class of methods, the coupling is "capacitive." Electrodes are provided within a process chamber, with the RF source applying a voltage between the electrodes. The plasma is formed between the electrodes and forms sheaths of relatively low electron density near solid surfaces. The RF voltage appears primarily across these sheaths as if they were the dielectric region of a capacitor.

One consequence of such capacitive coupling is the generation of an impedance $R-j/\omega C$ for resistance R and capacitance at frequency $\omega$, where j denotes $\sqrt{-1}$. Some compensation for this impedance may be provided with a fixed matching network, but the fixed nature of the matching network provides only a uniform compensation. The actual impedance associated with the capacitive coupling may be highly variable, depending on the specific processing characteristics that are used. There is accordingly a need in the art for a matching network capable of accommodating a variety of different processing characteristics for capacitively coupled plasmas.

BRIEF SUMMARY OF THE INVENTION

Embodiments of the invention thus provide a substrate processing system that comprises a processing chamber, an alternating voltage supply, and an impedance matching network. The processing chamber holds a substrate during processing and the alternating voltage supply is connected with the processing chamber to capacitively couple energy to a plasma formed within the processing chamber. The impedance matching network is coupled with the alternating voltage supply and comprises a variable resistive element and a variable reactive element. The variable resistive element has a first plurality of states to define distinct real parts of an impedance in accordance with the first plurality of states. The variable reactive element has a second plurality of states to define distinct imaginary parts of the impedance in accordance with the second plurality of states. In some embodiments, the alternating voltage supply comprises a radio-frequency voltage supply.

Different circuit arrangements may be used for the impedance matching network in different embodiments. In some instances, the alternating voltage supply includes an intrinsic resistive matching load. In such an embodiment, the variable resistive element may comprise a transformer for transforming the intrinsic resistive matching load into one of the distinct real parts of the impedance in accordance with a state of the transformer. The transformer may comprise a first coil that has a fixed number of turns coupled with the intrinsic resistive matching load and a secondary coil having a variable number of turns corresponding to the first plurality of states. The first plurality of states may consist of a finite number of discrete states, each defined by a position of a switch to select a number of turns in the secondary coil. Alternatively, the first plurality of states may be a continuum of states.

The variable reactive element may comprise a coil in series with the variable resistive element, the coil having a variable number of turns corresponding to the second plurality of states. In a specific such embodiment, the coil comprises a plurality of inductive elements connected in series with the variable resistive element, with the second plurality of states being defined by a state of a switch to select a subset of the plurality of inductive elements. Similar to the first plurality of states, the second plurality of states may consist of a finite number of discrete states in some embodiments, but may be a continuum of states in other embodiments.

A further understanding of the nature and advantages of the present invention may be realized by reference to the remaining portions of the specification and the drawings.

DETAILED DESCRIPTION OF THE INVENTION

Embodiments of the invention provide a matching network suitable for use in plasma processing systems to match an impedance resulting from capacitive coupling of the plasma. An overview of such plasma processing systems is provided with the schematic illustration in FIG. 1A. In this system, processing of a semiconductor substrate takes place in a process chamber 112 that is electrically coupled with an alternating voltage supply 104 that provides energy for plasma formation. The alternating voltage supply 104 may comprise an AC or an RF supply in different embodiments. A matching network 108 that includes separate variable controls for specifying real and imaginary parts of a complex impedance is interfaced with the alternating voltage supply. The variable control for each of the real and imaginary parts allows a state of the matching network to be selected to accommodate the specific impedance generated by the system for different plasma processing conditions.

The matching network may have independently controllable portions that define resistive and reactive elements, corresponding respectively to real and imaginary parts of the matching impedance. Each of these elements may have a plurality of states, which may be distributed discretely or continuously over a range in different embodiments, allowing the desired matching impedance to be selected in accordance with these states.

Figure 1A:
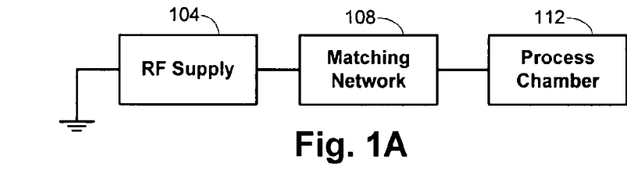
FIG. 1A provides a schematic overview of a plasma CVD processing system.
Figure 1B:
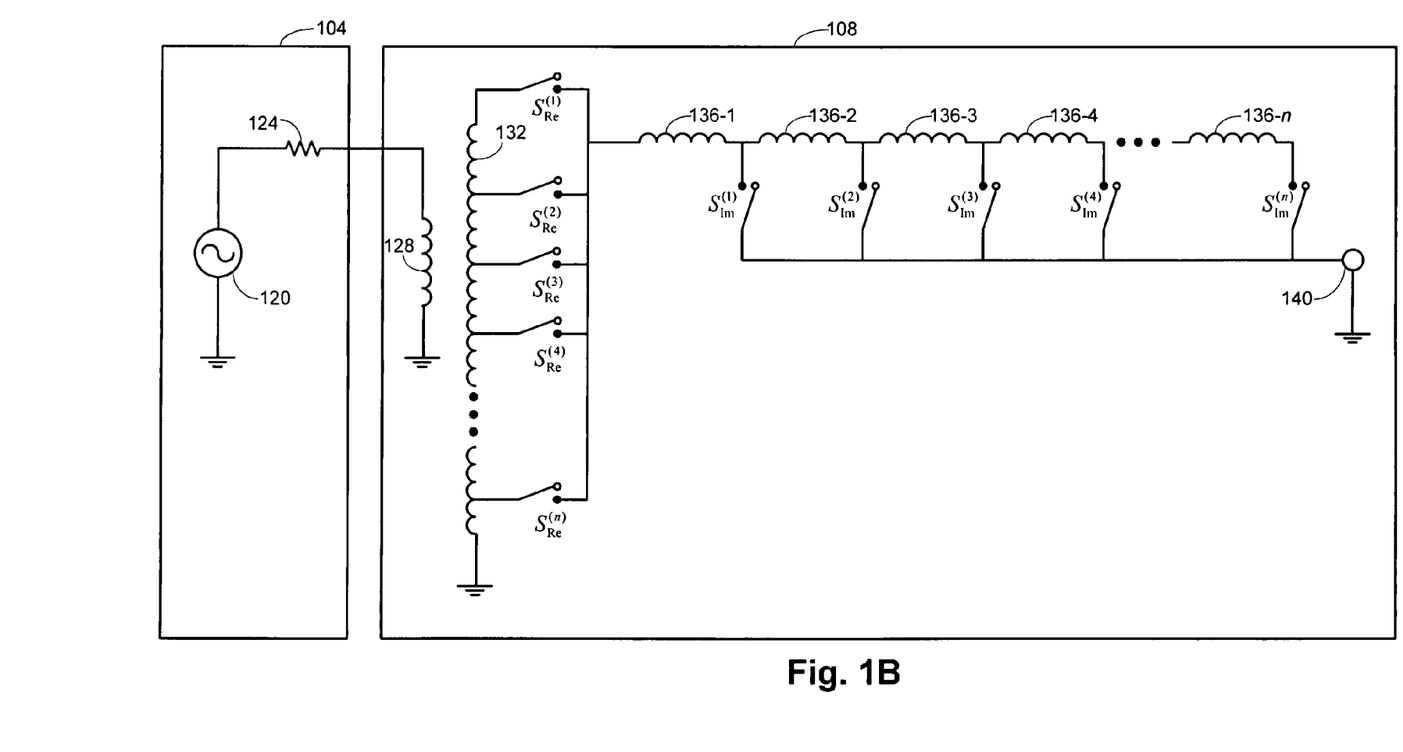
FIG. 1B provides a circuit diagram illustrating a matching network used as part of a plasma CVD processing system in one embodiment of the invention.

In many instances, the alternating voltage supply 104 may include an intrinsic resistive matching load, illustrated in FIG. 1B with resistance 124 provided in series with an alternating voltage source 120. For instance, RF generators are often constructed to match a 50-Ω resistive load. This intrinsic resistive matching load may be used by the matching network in providing the desired matching impedance. One example of a circuit that functions in this way is illustrated in FIG. 1B, in which the alternating voltage supply is coupled with a first coil 128 of a transformer comprised by the matching network. While the first coil 128 has a fixed number of turns, the number of turns of the second coil 132 of the transformer may be adjusted to select the desired real part of the matching impedance. The ability to select the number of turns of the second coil 132 may be achieved in one embodiment with a series arrangement of inductors and a set of switches $S_{Re}^{(i)}$ that allows completion of a circuit at different points along the series arrangement. In such an embodiment, the series arrangement of inductors defines the second coil 132, and the real part of the impedance Re Z is given by $(N_2/N_1)^2 R_i$, where $N_2$ and $N_1$ respectively denote the number of turns in the second and first coils 132 and 128 and $R_i$ denotes the intrinsic resistive matching load of the alternative voltage supply 104. In some embodiments, each of the individual inductors may have the same inductance, providing a linear set of resistance values that may be selected for the impedance. In other embodiments, the individual inductors may have different inductances to provide a nonlinear set of resistance values that may be selected for the impedance.

The imaginary part of the matching impedance may be selected with a similar coil provided in series with the variable resistive element, the coil having a variable number of turns to define the imaginary part of the impedance. In the embodiment shown in FIG. 1B, the coil comprises a serial arrangement of inductors 136 with a set of switches $S_{Im}^{(i)}$ that allows completion of a circuit at different points along the series arrangement. The imaginary part of the matching impedance is thus proportional to the sum of the inductances $L_i$ selected by the switch that is closed, Im $Z = \omega \Sigma L_i$. If the individual inductors 136 have the same inductance, the set of reactance values that may be selected will be linear, while a nonlinear set of reactance values may be provided by using inductors 136 having different inductances. The matching impedance thus provided at the output 140 for a voltage source having frequency ω is thus given by $$Z = \left(\frac{N_2}{N_1}\right)^2 R_i + j\omega \sum L_i$$

for the selected states of the variable resistive and reactive elements.

The matching network 108 may be embodied in a physical structure having knobs or other controls for determining the states of the variable resistive and reactive elements. For instance, in one embodiment, separate knobs that may be controlled by a human operator are provided to control the set of real impedance switches $S_{Re}$ and the set of imaginary impedance switches $S_{Im}$. In other embodiments, the switches may be controlled by a digital control mechanism, allowing the matching impedance to be set automatically by a controller that determines the appropriate matching impedance from defined process conditions.

While the circuit arrangement shown in FIG. 1B provides independent sets of discrete values for the resistive and reactive parts of the matching impedance, a continuous selection may be provided in other embodiments by using a rheostat configuration. Such a configuration may be used for one or both of the resistive and reactive elements, allowing a continuum of states to be selected to provide precise matching of the impedance. Furthermore, the specific implementation shown in FIG. 1B is not intended to be limiting. Other circuit configurations, including those that use resistive or capacitive elements instead of inductive elements and including those that use parallel circuit arrangements instead of series arrangements, may be used in alternative embodiments.

Figure 2:
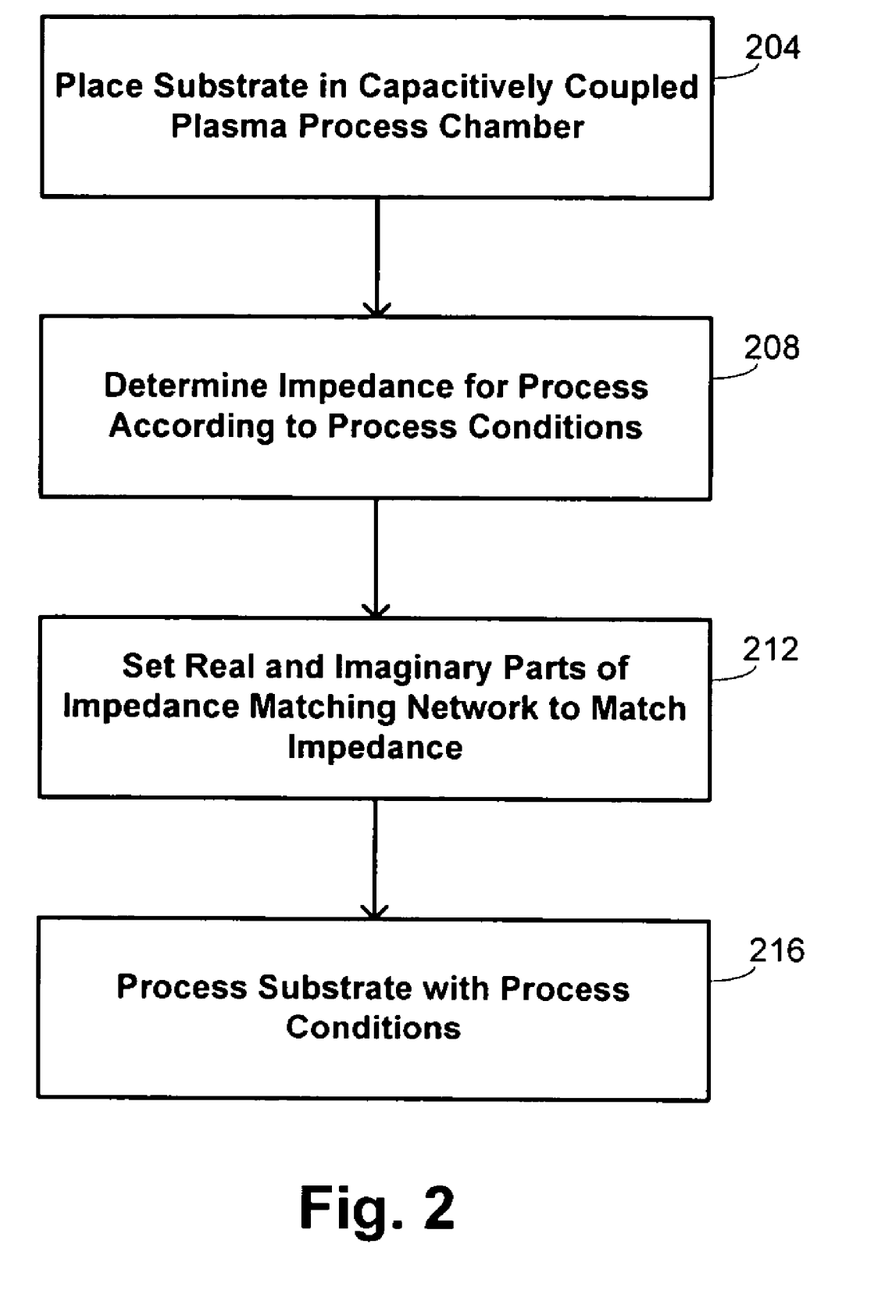
FIG. 2 provides a flow diagram illustrating a method for using a plasma CVD processing system in accordance with an embodiment.

Use of a processing system with the matching network described in connection with FIGS. 1A and 1B is straightforward for a defined process given the ability of the matching network to accommodate different impedances. An overview for using such a system is thus illustrated with the flow diagram of FIG. 2. At block 204, a substrate is placed in a capacitively coupled plasma processing chamber. The impedance for the process to be performed on the substrate is determined at block 208, either by a human operator or automatically by a controller that determines the impedance from the process conditions. The real and imaginary parts of the impedance matching network 108 are set at block 212, again either by a human operator or by an automatic controller. The use of an automatic controller simplifies changing the matching impedance during a process that has conditions that vary over time.

Exemplary CVD System

Figure 3A:
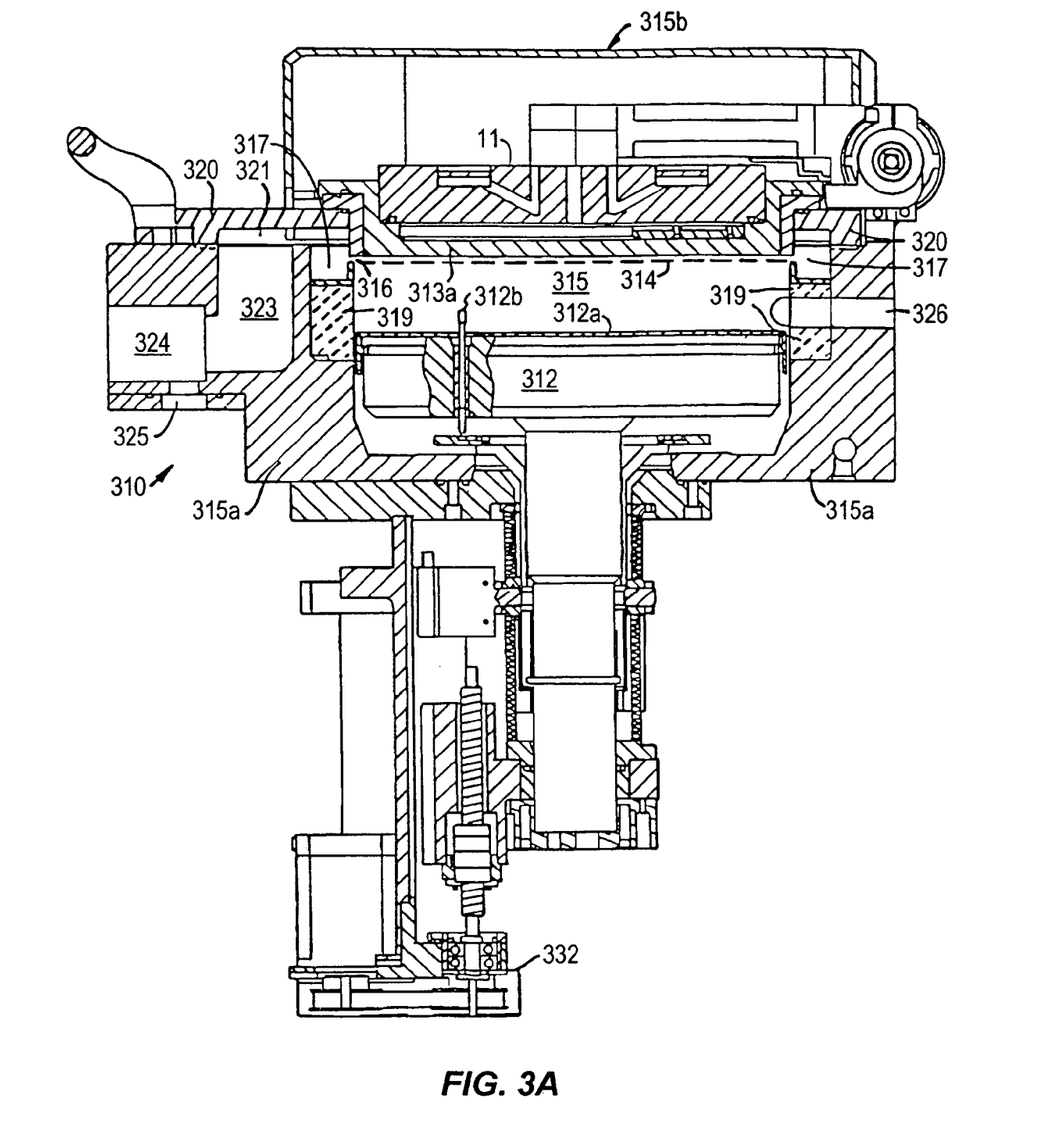
FIGS. 3A and 3B are vertical, cross-sectional views of one embodiment of a chemical vapor deposition apparatus according to the present invention.
Figure 3B:
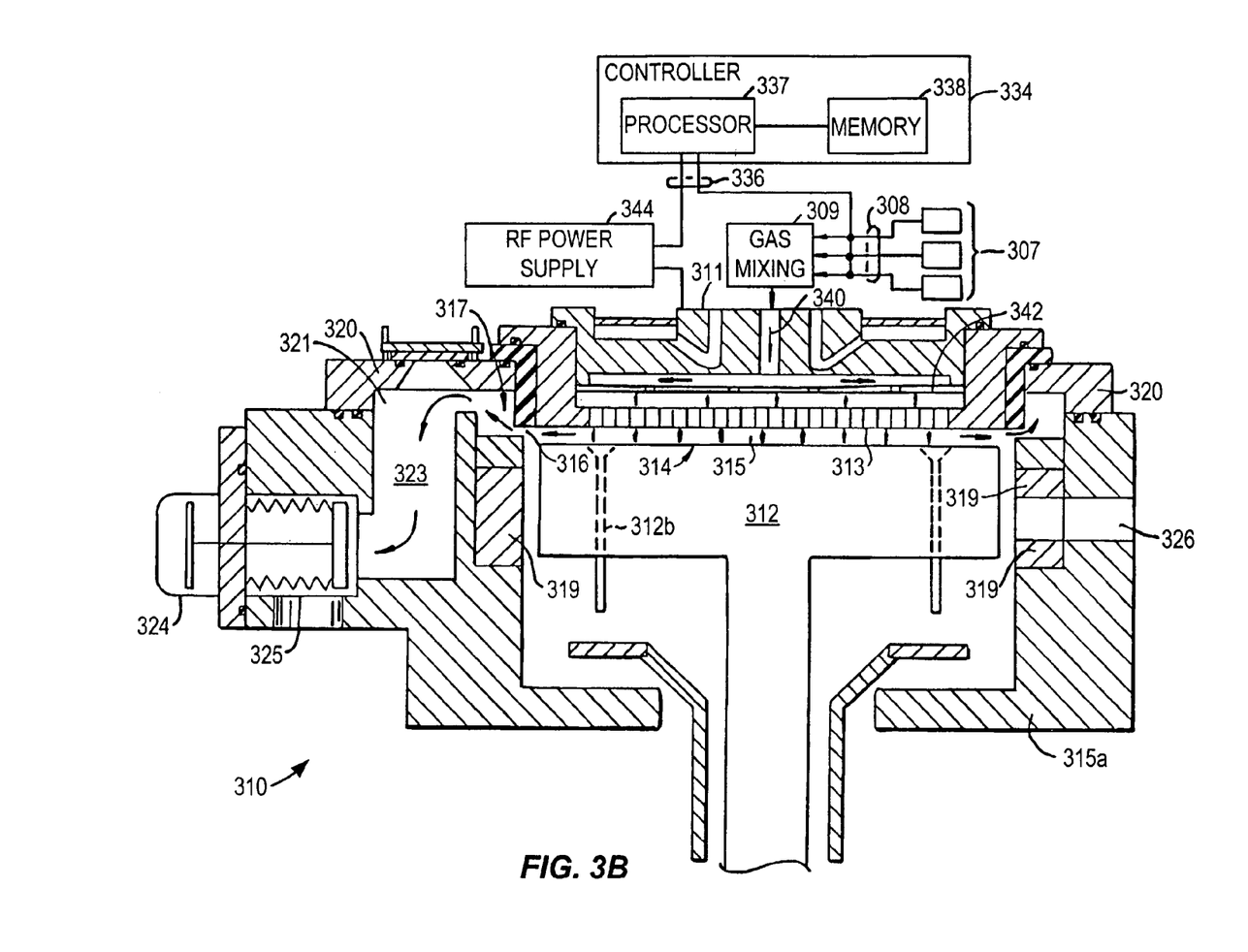
Figure 3C:
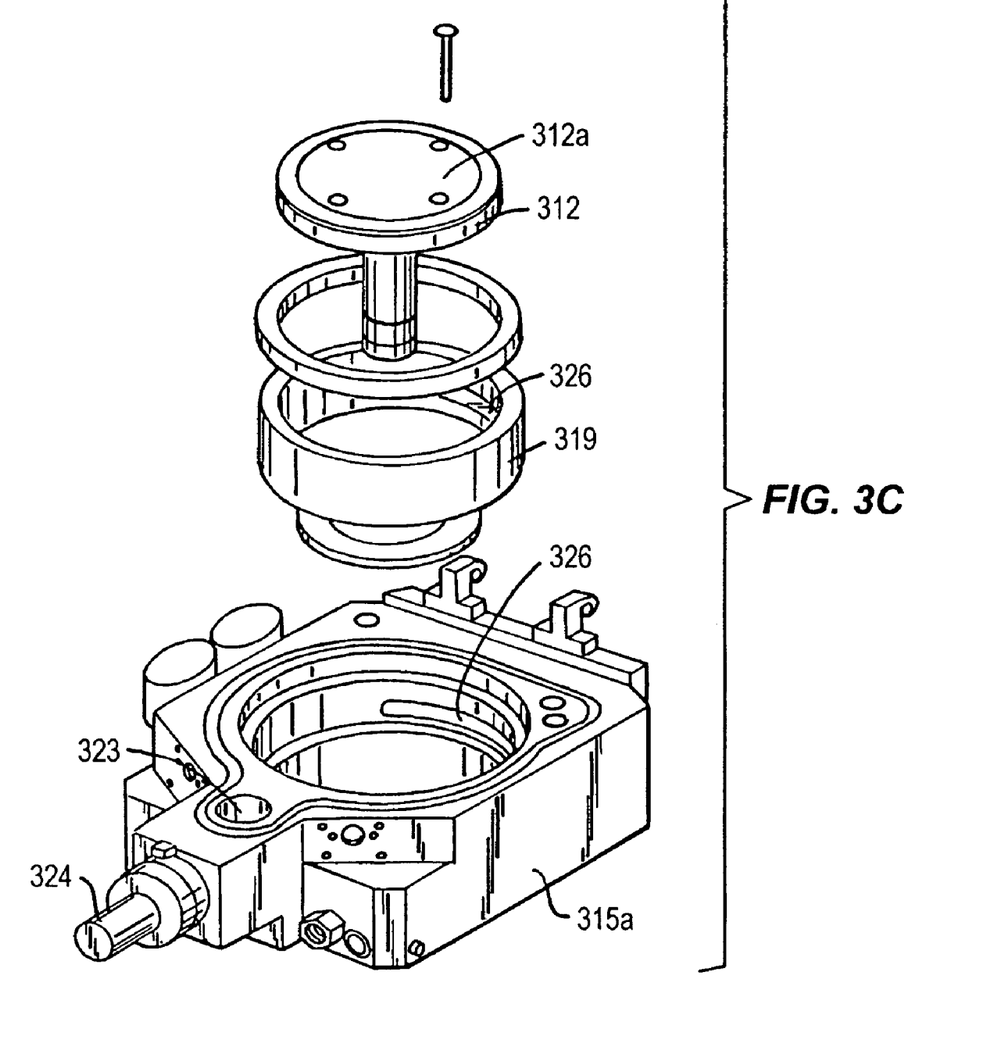
FIGS. 3C and 3D are exploded perspective views of parts of the CVD chamber depicted in FIG. 1A.

One suitable CVD apparatus in which the matching networks and methods for matching impedance of the present invention can be carried out is shown in FIGS. 3A and 3B, which are vertical, cross-sectional views of a CVD system 310, having a vacuum or processing chamber 315 that includes a chamber wall 315a and chamber lid assembly 315b. Chamber wall 315a and chamber lid assembly 315b are shown in exploded, perspective views in FIGS. 1C and 1D.

CVD system 310 contains a gas distribution manifold 311 for dispersing process gases to a substrate (not shown) that rests on a heated pedestal 312 centered within the process chamber. During processing, the substrate (e.g. a semiconductor wafer) is positioned on a flat (or slightly convex) surface 312a of pedestal 12. The pedestal can be moved controllably between a lower loading/off-loading position (depicted in FIG. 3A) and an upper processing position (indicated by dashed line 314 in FIG. 3A and shown in FIG. 3B), which is closely adjacent to manifold 311. A centerboard (not shown) includes sensors for providing information on the position of the wafers.

Figure 3D:
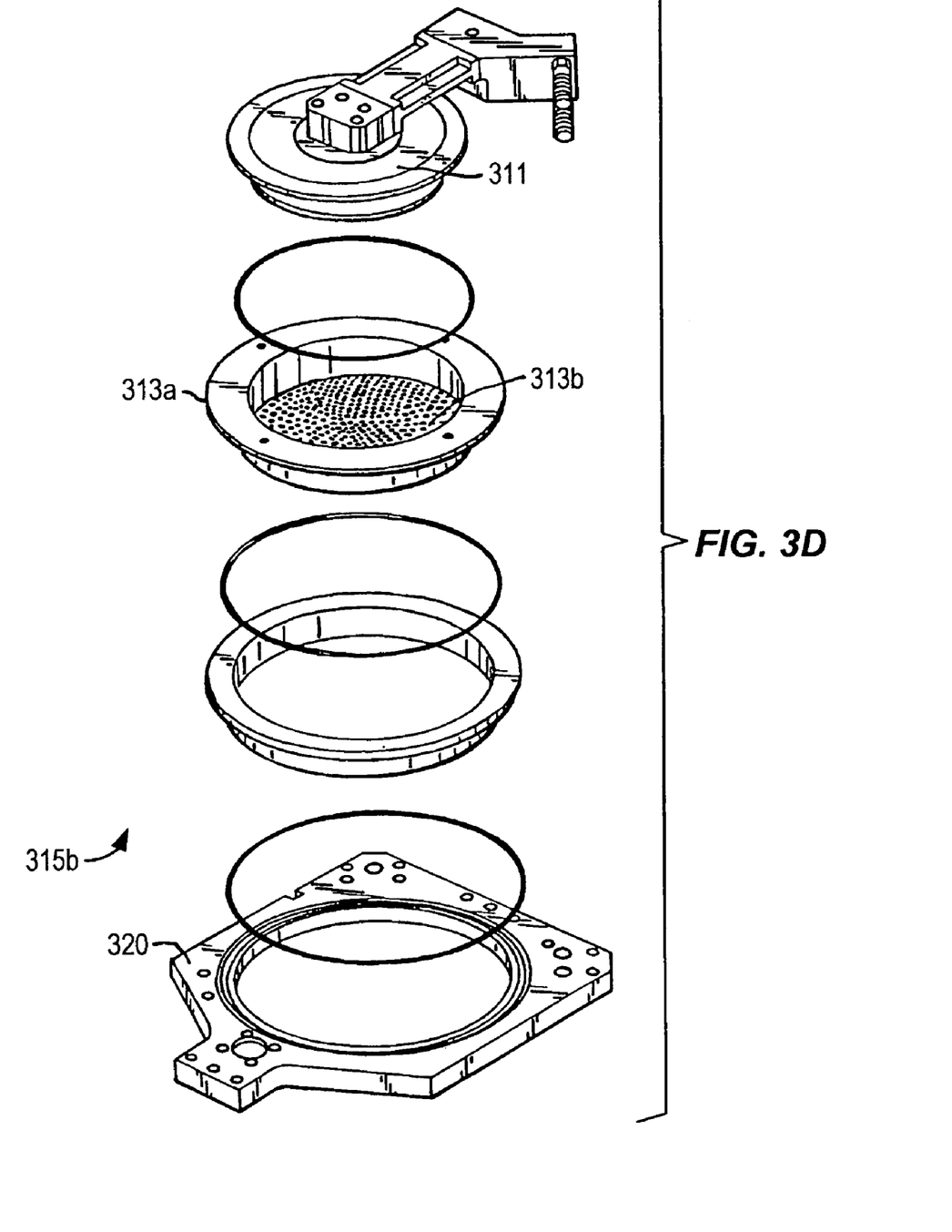

Deposition and carrier gases are introduced into chamber 315 through perforated holes 313b (FIG. 1D) of a conventional flat, circular gas distribution or faceplate 313a. More specifically, deposition process gases flow into the chamber through the inlet manifold 311 (indicated by arrow 340 in FIG. 3B), through a conventional perforated blocker plate 342 and then through holes 313b in gas distribution faceplate 313a.

Before reaching the manifold, deposition and carrier gases are input from gas sources 307 through gas supply lines 308 (FIG. 3B) into a mixing system 309 where they are combined and then sent to manifold 311. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in CVD system 310 can be a plasma-enhanced process, in which case an RF power supply 344 applies electrical power between the gas distribution faceplate 313a and the pedestal so as to excite the process gas mixture to form a plasma within the cylindrical region between the faceplate 313a and the pedestal. (This region will be referred to herein as the "reaction region"). Constituents of the plasma react to deposit a desired film on the surface of the semiconductor wafer supported on pedestal 312. RF power supply 344 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 315. The matching network described above may be provided in operative communication with the RF power supply 344 to provide the impedance matching described above.

During a plasma-enhanced deposition process, the plasma heats the entire process chamber 310, including the walls of the chamber body 315a surrounding the exhaust passageway 323 and the shut-off valve 324. When the plasma is not turned on or during a thermal deposition process, a hot liquid is circulated through the walls 315a of the process chamber to maintain the chamber at an elevated temperature. A portion of these heat exchanging passages 318 in the lid of chamber 310 is shown in FIG. 3B. The passages in the remainder of chamber walls 315a are not shown. Fluids used to heat the chamber walls 315a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber by a vacuum pump (not shown). Specifically, the gases are exhausted through an annular, slot-shaped orifice 316 surrounding the reaction region and into an annular exhaust plenum 317. The annular slot 316 and the plenum 317 are defined by the gap between the top of the chamber's cylindrical side wall 315a (including the upper dielectric lining 319 on the wall) and the bottom of the circular chamber lid 320. The 360° circular symmetry and uniformity of the slot orifice 316 and the plenum 317 are important to achieving a uniform flow of process gases over the wafer so as to deposit a uniform film on the wafer.

From the exhaust plenum 317, the gases flow underneath a lateral extension portion 321 of the exhaust plenum 317, past a viewing port (not shown), through a downward-extending gas passage 323, past a vacuum shut-off valve 324 (whose body is integrated with the lower chamber wall 315a), and into the exhaust outlet 325 that connects to the external vacuum pump (not shown) through a foreline (also not shown).

The wafer support platter of the pedestal 312 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 312.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 is assigned to Applied Materials, Inc., the assignee of the present invention, and is hereby incorporated by reference in its entirety.

A lift mechanism and motor 332 (FIG. 3A) raises and lowers the heater pedestal assembly 312 and its wafer lift pins 312b as wafers are transferred into and out of the body of the chamber by a robot blade (not shown) through an insertion/removal opening 326 in the side of the chamber 310. The motor 332 raises and lowers pedestal 312 between a processing position 314 and a lower, wafer-loading position. The motor, valves or flow controllers connected to the supply lines 308, gas delivery system, throttle valve, RF power supply 344, and chamber and substrate heating systems are all controlled by a system controller 334 (FIG. 3B) over control lines 336, of which only some are shown. Controller 334 relies on feedback from optical sensors to determine the position of movable mechanical assemblies such as the throttle valve and susceptor which are moved by appropriate motors under the control of controller 334.

The above reactor description is mainly for illustrative purposes, and other capacitively coupled plasma CVD equipment may be employed in other embodiments. Additionally, variations of the above-described system, such as variations in pedestal design, heater design, RF power frequencies, location of RF power connections and others are possible. For example, the wafer could be supported by a susceptor and heated by quartz lamps. The matching networks and methods for impedance matching of the present invention are not limited to any specific apparatus.

What is claimed is:

1. A substrate processing system comprising:
   a processing chamber for holding a substrate during processing;
   an alternating voltage supply connected with the processing chamber to capacitively couple energy to a plasma formed within the processing chamber; and
   an impedance matching network coupled with the alternating voltage supply, the impedance matching network comprising:
   a variable resistive element having a first plurality of states to define distinct real parts of an impedance in accordance with the first plurality of states; and
   a variable reactive element having a second plurality of states to define distinct imaginary parts of the impedance in accordance with the second plurality of states.

2. The substrate processing system recited in claim 1 wherein the second plurality of states consists of a finite number of discrete states.

3. The substrate processing system recited in claim 1 wherein the second plurality of states is a continuum of states.

4. The substrate processing system recited in claim 1 wherein the first plurality of states consists of a finite number of discrete states.

5. The substrate processing system recited in claim 1 wherein the first plurality of states is a continuum of states.

6. The substrate processing system recited in claim 1 wherein the alternating voltage supply comprises a radio-frequency voltage supply.

7. The substrate processing system recited in claim 1 wherein the variable reactive element comprises a coil in series with the variable resistive element, the coil having a variable number of turns corresponding to the second plurality of states.

8. The substrate processing system recited in claim 7 wherein the coil comprises a plurality of inductive elements connected in series with the variable resistive element, the second plurality of states being defined by a state of a switch to select a subset of the plurality of inductive elements.

9. The substrate processing system recited in claim 1 wherein the alternating voltage supply includes an intrinsic resistive matching load.

10. The substrate processing system recited in claim 9 wherein the variable resistive element comprises a transformer for transforming the intrinsic resistive matching load into one of the distinct real parts of the impedance in accordance with a state of the transformer.

11. The substrate processing system recited in claim 10 wherein the transformer comprises:
   a first coil having a fixed number of turns coupled with the intrinsic resistive matching load; and
   a secondary coil having a variable number of turns corresponding to the first plurality of states.

12. The substrate processing system recited in claim 11 wherein the first plurality of states consists of a finite number of discrete states, each such state being defined by a position of a switch to select a number of turns in the secondary coil.

13. The substrate processing system recited in claim 11 wherein the first plurality of states is a continuum of states.

14. A method for processing a substrate, the method comprising:
   positioning the substrate in a processing chamber;
   capacitively coupling an alternating voltage supply with the processing chamber to couple energy to a plasma formed within the processing chamber; and
   matching an impedance defined by processing conditions for the substrate, comprising:
      matching a real part of the impedance by selecting one of a first plurality of states of a variable resistance element coupled with the alternating voltage supply; and
      matching an imaginary part of the impedance by selecting one of a second plurality of states of a variable reactive element coupled with the alternating voltage supply.

15. The method recited in claim 14 wherein the alternating voltage supply comprises a radio-frequency voltage supply.

16. The method recited in claim 14 wherein:
   the variable reactive element comprises a coil in series with the variable resistive element, the coil having a variable number of turns corresponding to the second plurality of states; and
   matching the imaginary part of the impedance comprises selecting the number of turns for the coil.

17. The method recited in claim 16 wherein:
   the coil comprises a plurality of inductive elements connected in series with the variable resistive element; and
   selecting the number of coils comprises selecting a state of a switch to select a subset of the plurality of inductive elements.

18. The method recited in claim 14 wherein:
   the alternating voltage supply includes an intrinsic resistive matching load; and
   matching the real part of the impedance comprises transforming the intrinsic resistive matching load with a transformer in accordance with a state of the transformer.

19. The method recited in claim 18 wherein:
   the transformer comprises a first coil having a fixed number of turns coupled with the resistive matching load and a second coil having a variable number of turns corresponding to the first plurality of states; and
   matching the real part of the impedance comprises selecting the number of turns for the second coil.

20. The method recited in claim 19 wherein:
   the first plurality of states consists of a finite number of discrete states, each such state being defined by a position of a switch to select a number of turns in the secondary coil; and
   matching the real part of the impedance comprises positioning the switch.

21. The method recited in claim 19 wherein the first plurality of states is a continuum of states.

* * * * *